United States Patent
Liu et al.

(10) Patent No.: US 7,800,025 B2
(45) Date of Patent: Sep. 21, 2010

(54) APPARATUS FOR CONTROLLING AN ELECTRICAL COOKER AND RELATED METHOD THEREOF

(75) Inventors: Wen-Liang Liu, Hsinchu (TW); Chin-Hung Yang, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 589 days.

(21) Appl. No.: 11/757,515

(22) Filed: Jun. 4, 2007

(65) Prior Publication Data

US 2008/0173633 A1    Jul. 24, 2008

(30) Foreign Application Priority Data

Jan. 19, 2007    (TW) ............... 96102104 A

(51) Int. Cl.
*B23K 13/08*    (2006.01)
(52) U.S. Cl. .................. 219/484; 327/237; 377/12; 377/16
(58) Field of Classification Search .......... 219/484; 345/173; 377/12, 16; 327/237
See application file for complete search history.

(56) References Cited

U.S. PATENT DOCUMENTS

2003/0026372 A1* 2/2003 Boerstler et al. ............ 375/376

FOREIGN PATENT DOCUMENTS

| JP | 62-159214 A | 7/1987 |
| JP | 11-136116 A | 5/1999 |
| JP | 11-161429 A | 6/1999 |
| JP | 2006-333148 A | 12/2006 |
| TW | 286371 | 1/2006 |

* cited by examiner

*Primary Examiner*—Tu B Hoang
*Assistant Examiner*—Brian Jennison
(74) *Attorney, Agent, or Firm*—WPAT, PC; Justin King

(57) ABSTRACT

The present invention provides a micro-control unit a RC oscillator for generating a reference clock, a plurality of touch switches for generating a transition signal indicating one of the touch switches being touched by human beings, a plurality of analog switches coupled to the touch switches for controlling transmission of the transition signal and a plurality of counters for counting time, all of the counters stop counting when one of the counters overflows and content of all counters being read, wherein ON/OFF of the analog switches controlled by a software.

6 Claims, 12 Drawing Sheets

| 1st data | D0 | D1 | D2 | D3 | D4 | D5 | D6 | D7 | D8 |

D8 is even parity of bits D0~D7

| 2nd data | D9 | D10 | D11 | D12 | D13 | D14 | D15 | D16 | D17 |

D17 is even parity of bits D9~D16

| 3rd data | D18 | D19 | D20 | D21 | D22 | D23 | D24 | D25 | D26 |

D26 is even parity of bits D18~D25

| 4th data | D27 | D28 | D29 | D30 | D31 | D32 | D33 | D34 | D35 |

D35 is even parity of bits D27~D34

| 5th data | D36 | D37 | D38 | D39 | D40 | D41 | D42 | D43 | D44 |

D44 is even parity of bits D36~D43

| 6th data | D45 | D46 | D47 | D48 | D49 | D50 | D51 | D52 | D53 |

D53 is even parity of bits D45~D52

| 7th data | D54 | D55 | D56 | D57 | D58 | D59 | D60 | D61 | D62 |

D62 is even parity of bits D54~D61

| 8th data | D63 | D64 | D65 | D66 | D67 | D68 | D69 | D70 | D71 |

D71 is even parity of bits D63~D70

| | D72 | D73 | D74 | D75 | D76 | D77 | D78 | D79 | D80 |

D80 is even parity of bits D72~D79

FIG. 11

APPARATUS FOR CONTROLLING AN ELECTRICAL COOKER AND RELATED METHOD THEREOF

BACKGROUND OF THE INVENTION

1. Field of the Invention

The invention relates to an apparatus for controlling an electrical cooker and a method for detecting states of a plurality of touch switches, and more particularly to a microcontroller comprises a RC oscillator, a plurality of touch switches, a plurality of analog switches and two counters to simplify peripheral devices and utilize a software to adjust the sensitivity of the touch switches.

2. Description of the Related Art

In modern life, 3C products hold a large part of modern life. The consumer electronics become light, thin, short, small and smart. For example, an electrical magnetic cooker, a hotplate or a rice cooker, it is easy to use for cooking or heating food and only need electrical power. It is also safe than a cooker with gas and fire.

Generally, input devices of conventional electrical cookers are mechanical button. The shortage of the mechanical button is elasticity fatigue by frequently pressing, or shape changed because of high temperature. In other hand, some electrical cookers have touch switches, but it is complicated to design. Besides a basic micro-control unit, many different electric devices, for example, a device for adjusting the sensitivity of the touch switch, are also need. Consequently, it causes the higher cost.

Referring to FIG. 1, it is a functional block diagram of a conventional controller of an electrical cooker. The controller comprises a major micro-control unit 11, a driving circuit 12 coupled to the major micro-control unit 11 for driving a light-emitting diode 13, a panel control unit 14 coupled to coupled to the major micro-control unit 11 for data transmission, an analog switch 15 coupled to the panel control unit 14 for passing a signal received from a touch switch 16, a RC oscillator 17 for generating a frequency according to the composition of a RC circuit 18. The panel control unit 14 is able to determine the states (ON/OFF) of the touch switch 16 with software and transmits the states of the touch switch 16 to the major micro-control unit 11, and the driving circuit 12 is controlled by the major micro-control unit 11 to drive light-emitting diode 13 correspondingly. The software, however, may cause error/inaccuracy of the RC oscillator 17 because of timing of executing instructions. In the other hand, it is complex to combine the panel control unit 14 with other devices (15, 16, 17 and 18).

Referring to FIG. 2 and FIG. 3, it is a flowchart showing detection of the touch switches of the conventional controller. In the flowchart, we can find that calculating frequency of RC oscillator is after many steps including the counter counts, delay several milliseconds (step 193), stop the counter (step 197), read the content of the counter (step 197) and etc. It is understood that the conventional electrical cooker has many electric devices, the procedure is very complicated and also unstable.

BRIEF SUMMARY OF THE INVENTION

To solve the disadvantage of the prior art. The present invention provides an apparatus for controlling an electrical cooker, a method for detecting states of a plurality of touch switches and a micro-control unit.

The present invention provides an apparatus for controlling an electrical cooker comprises a touch switch for generating a transition signal, a panel control unit for processing and detecting states of the touch switch and a micro-control unit for receiving an electric signal transmitted by the panel control unit and controlling power the electrical cooker.

The present invention also provides a micro-control unit comprises a RC oscillator for generating a reference clock, a plurality of touch switches for generating a transition signal indicating one of the touch switches being touched by human beings, a plurality of analog switches coupled to the touch switches for controlling transmission of the transition signal and a plurality of counters for counting time, whereby all of the counters stop counting when one of the counters overflows and content of all counters being read, wherein ON/OFF of the analog switches controlled by a software.

The present invention also provides a method for detecting states of a plurality of touch switches comprises determining one of the touch switches for detection, setting source of a first counter, configuring the first counter and a second counter to stop counting when the first counter overflows, initializing the first counter and the second counter, starting a RC oscillator, the first counter and the second counter, determining whether the first counter and the second counter stop or not, storing content of the first counter in a first memory(X0) of a micro-controller, initializing the first counter, setting content of the second counter to 0, starting the RC oscillator, the first counter and the second counter, determining whether the first counter and the second counter stop or not, storing content of the first counter in a second memory(X1) of the micro-controller and determining whether (X0−X1) is larger than a sensitivity value or not.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 11 is a schematic diagram showing the data format of the panel control unit and the micro-control unit according to an embodiment of the present invention.

DETAILED DESCRIPTION OF THE INVENTION

Figure 1:
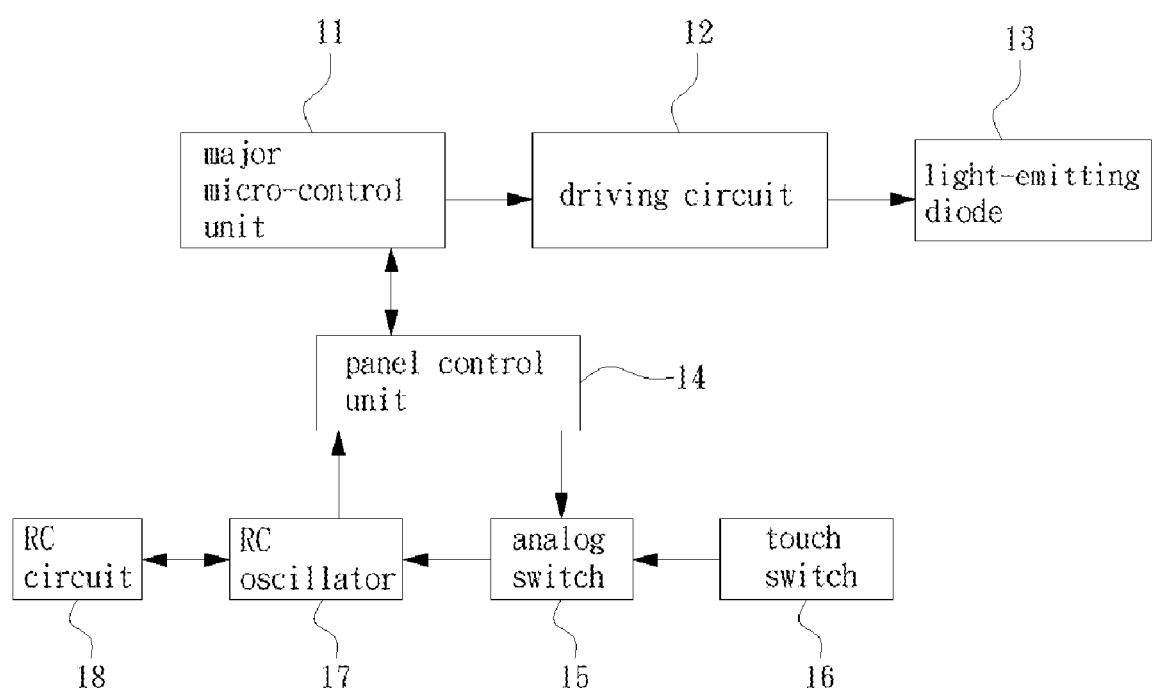
FIG. 1 is a functional block diagram of a conventional controller of a electrical cooker.
Figure 2:
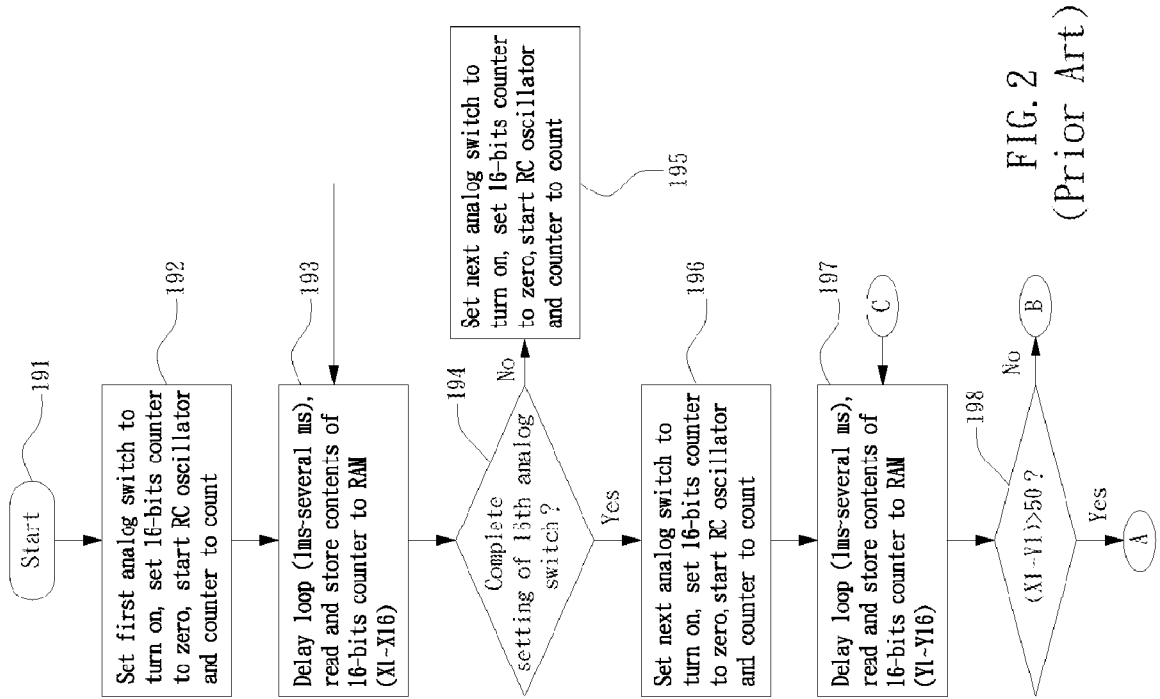
FIG. 2 and FIG. 3 are flowcharts showing detection of the touch switches of the conventional controller.
Figure 3:
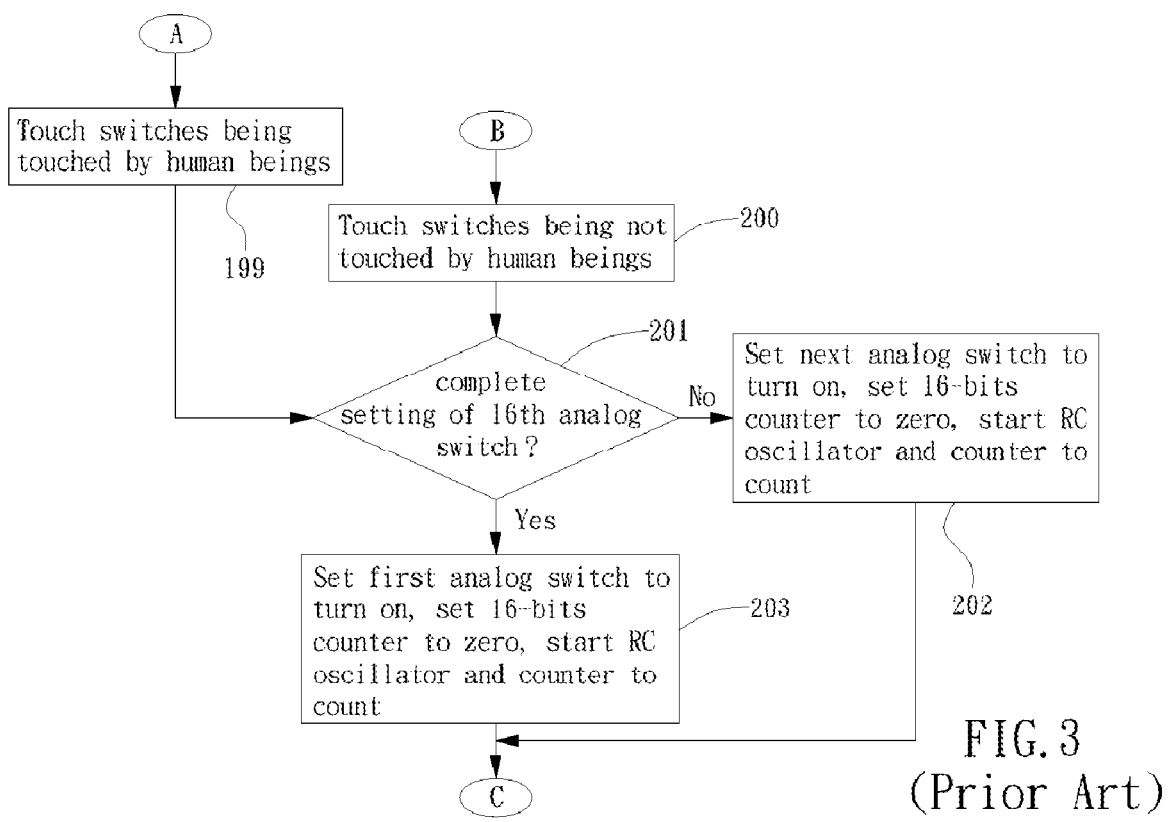

Several exemplary embodiments of the invention are described with reference to FIGS. 4 through 11, which generally relate to an apparatus for controlling an electrical cooker. It is to be understood that the following disclosure provides various different embodiments as examples for implementing different features of the invention. Specific examples of components and arrangements are described in the following to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various described embodiments and/or configurations.

The invention discloses an apparatus for controlling an electrical cooker, a method for detecting states of a plurality of touch switches and a micro-control unit.

Figure 4:
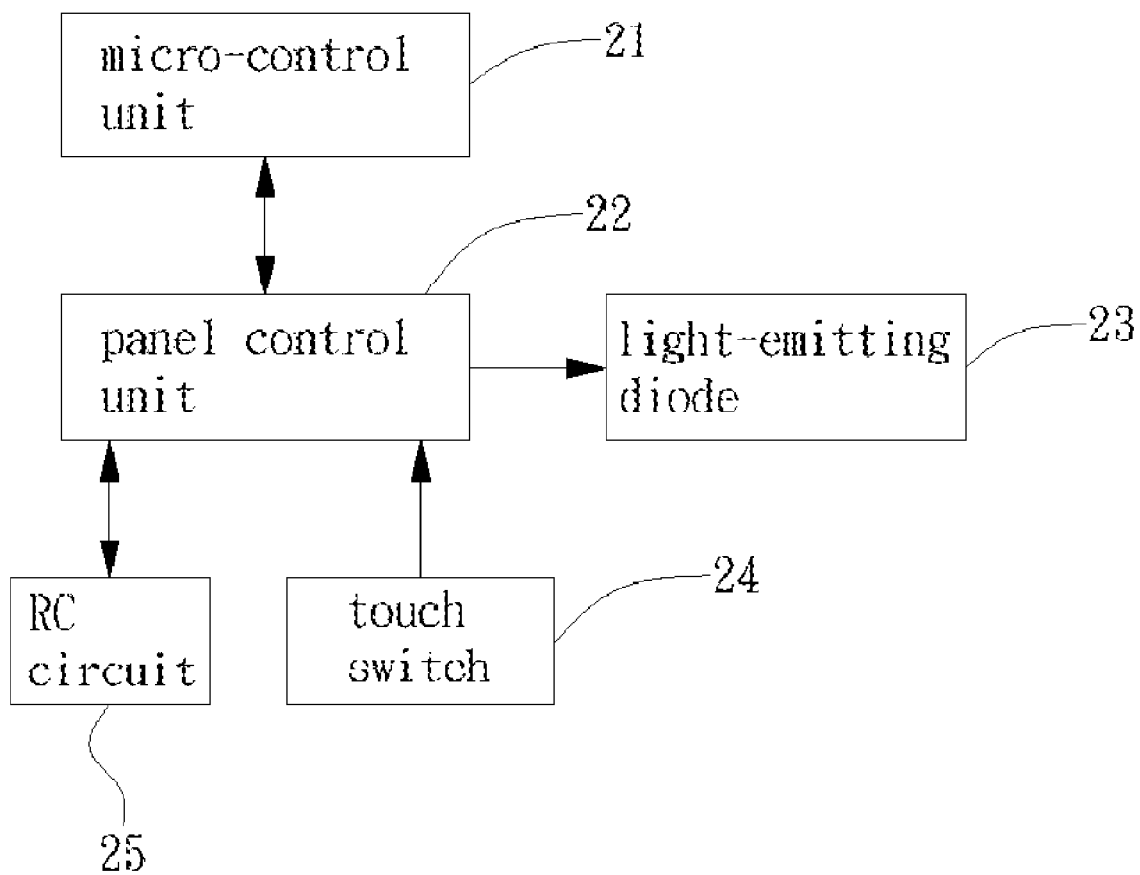
FIG. 4 is a functional block diagram of an apparatus for controlling a electrical cooker according to an embodiment of the present invention.

Referring to FIG. 4, it is a functional block diagram of an apparatus for controlling an electrical cooker according to an embodiment of the present invention.

The apparatus comprises a touch switch 24 for generating a transition signal when the touch switch 24 is touched by human beings, a panel control unit 22 for processing and detecting states of the touch switch 24 and a micro-control unit 21 for receiving an electric signal transmitted by the panel control unit 22 and controlling power the electrical cooker. A light-emitting diode (LED) circuit 23 coupled to the panel control unit 22 is controlled by the micro-control unit 21 to drive LEDs (not shown). The panel control unit 22 transmits states of the touch switch 24 to the micro-control unit 21 and receives information from the micro-control unit 21 to light the LEDs of the LED circuit 23. The panel control unit 22 detects, for example, 16 touch switches by software, a RC oscillator included in itself, two 16-bits counters and 16 analog switches. The panel control unit 22 utilizes two built-in 8-bits counters and 16 pins having enforced driving capability to light 64 LEDs. The micro-control unit 21 communicates the panel control unit 22 with 3 pins, and transmits the states of the touch switch 24 and information about lighting LEDs.

Figure 5:
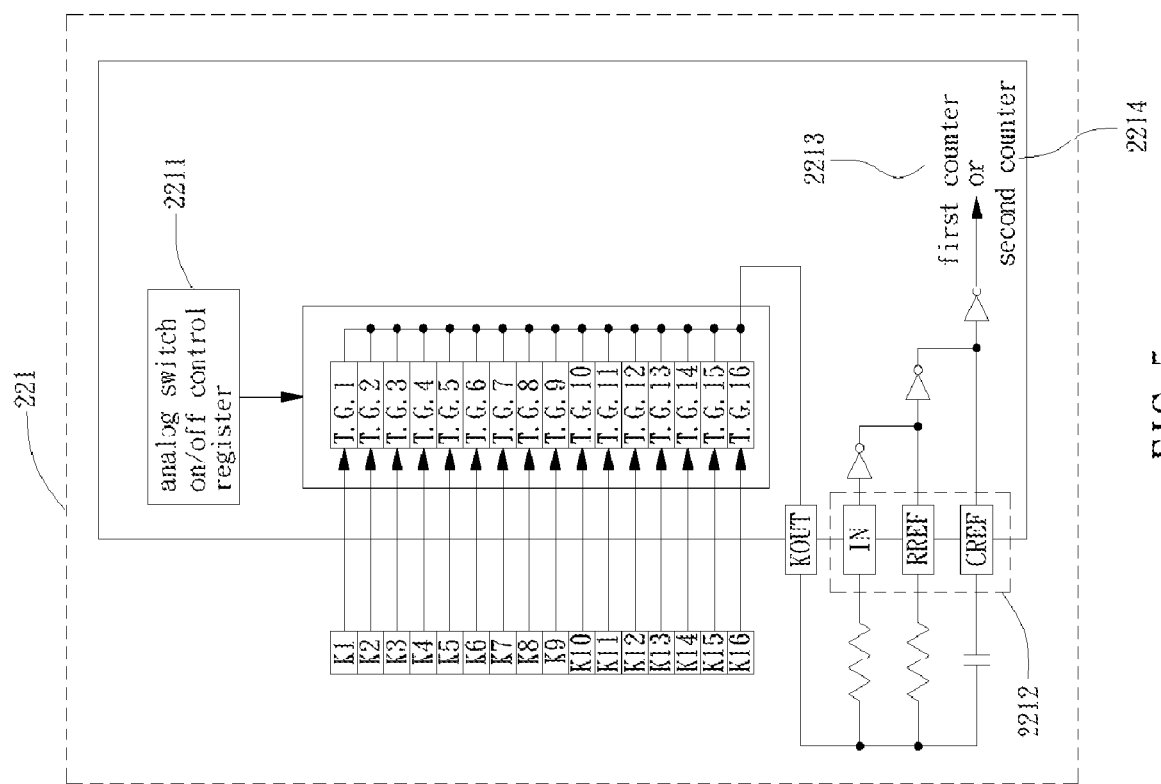
FIG. 5 is a functional block diagram of a panel control unit according to an embodiment of the present invention.

Referring to FIG. 5, it is a functional block diagram of an IC circuit in the panel control unit 22 according to an embodiment of the present invention.

The IC circuit 221 comprises a RC oscillator, a first counter 2213, a second counter 2214, three pins (IN, RREF, CREF) 2212 and an analog switch on/off control register (ASON) 2211. The first counter 2213 and the second counter 2214 are, for example, 8-bits counters. The RC oscillator and two counters 2213, 2214 have the same control source to start at the same time. In this embodiment, the first counter 2213 has a default value could be configured by software. When the first counter 2213 overflows, two counters stop counting at the same time and the content of two counters are stored. The software can set which analog switches (T.G.1~T.G.16) to turn on and pass the input (K1~K16) accordingly. K1~K16 are pins of the IC circuit 221 and coupled to the touch switches like a piece of metal covered glass/acrylic or copper ring covered glass/acrylic on a circuit board. KOUT is one of pins of the IC circuit 221 and coupled to K1~K16 via T.G.1~T.G.16. The ASON 2211 could turn one of T.G.1~T.G.16 on and one corresponding pins K1~K16 will connect to KOUT, the ASON reference table is shown in Table 1. When one of touch switches K1~K16 is touched by human beings, the frequency of RC will be changed and a transition signal is transmitted through one of analog switches (T.G.1~T.G.16) to KOUT. The RC oscillator is the combination of resisters and capacitor correspondingly coupled to IN, RREF and CREF pins.

TABLE 1

| Bit No. | Label | Function |
|---|---|---|
| 0-4 | ASON | Defines the analog switch for K1-K16 which is on.<br>ASON=<br>00000b = Analog switch 1 on, other analog switch off<br>00001b = Analog switch 2 on, other analog switch off<br>00010b = Analog switch 3 on, other analog switch off<br>00011b = Analog switch 4 on, other analog switch off<br>00100b = Analog switch 5 on, other analog switch off<br>00101b = Analog switch 6 on, other analog switch off<br>00110b = Analog switch 7 on, other analog switch off<br>00111b = Analog switch 8 on, other analog switch off<br>01000b = Analog switch 9 on, other analog switch off<br>01001b = Analog switch 10 on, other analog switch off<br>01010b = Analog switch 11 on, other analog switch off<br>01011b = Analog switch 12 on, other analog switch off<br>01100b = Analog switch 13 on, other analog switch off<br>01101b = Analog switch 14 on, other analog switch off<br>01110b = Analog switch 15 on, other analog switch off<br>01111b = Analog switch 16 on, other analog switch off<br>1xxxxb = All analog switch off |
| 5-7 | — | Unused bit, read as "0" |

Figure 6:
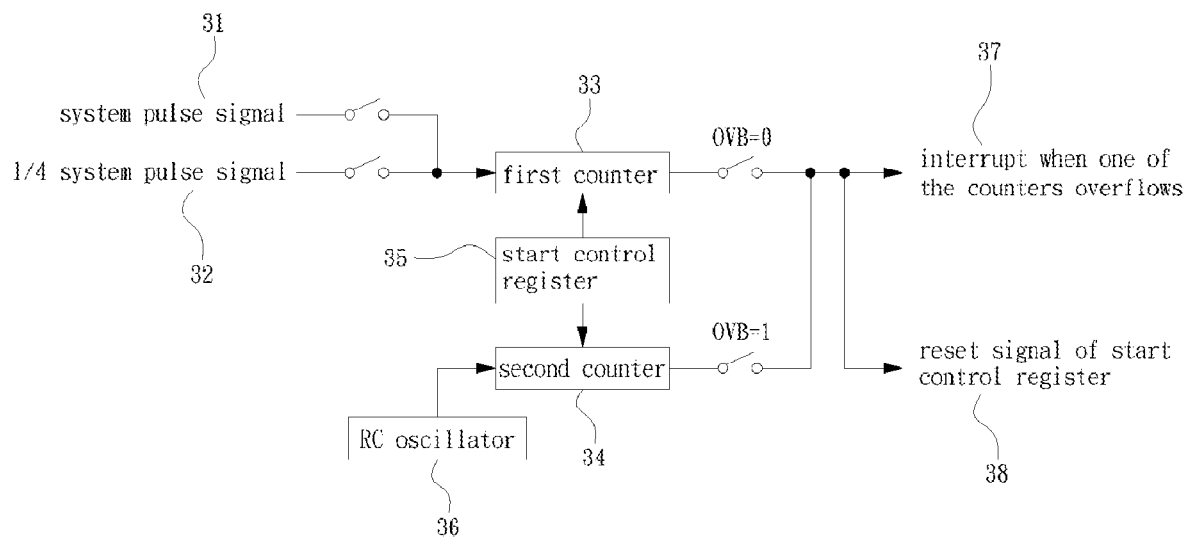
FIG. 6 is a schematic diagram of two counters according to an embodiment of the present invention.

Referring to FIG. 6, it is a schematic diagram of two counters according to an embodiment of the present invention.

The first counter 33 receives a system pulse signal 31 and a ¼ system pulse signal 32. The second counter 34 receives the output of the RC oscillator 36. A start control register (T1ON) 35 connects to the first counter 33 and the second counter 34. The operation is as follow:
 a. determining the input of the first counter 33 is the system pulse signal 31 or the ¼ system pulse signal 32;
 b. transmitting signal of the RC oscillator 36 to the second counter 34;
 c. generating an interrupt when the first counter 33 or the second counter 34 overflows to reset T1ON 35 to zero whereby stop the first counter 33 or the second counter 34 counting, wherein the first counter 33 and the second counter 34 is selected by the OVB control register;
 d. In the step c, the T1ON 35 controls two counters to start counting when T1ON is 1 and to stop counting when T1ON is 0.

The operation described above also could apply to a case of multiple touch switches by increasing multiple ASONs for detecting multiple touch switches one by one.

Figure 7:
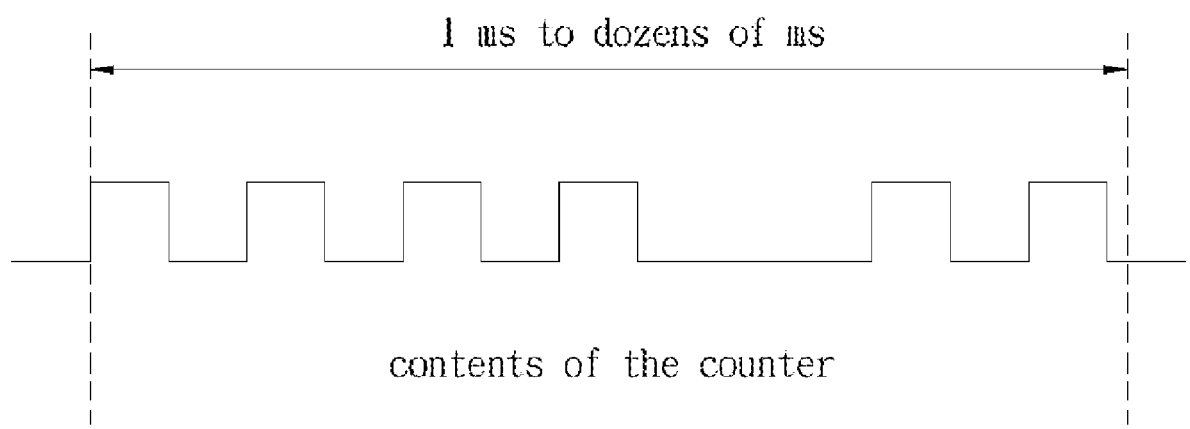
FIG. 7 is a schematic diagram showing content of the counter transmitted by the RC oscillator according to an embodiment of the present invention.

Referring to FIG. 7, it is a schematic diagram showing content of the counter transmitted by the RC oscillator according to another embodiment of the present invention. The frequency of the signal transmitted from the RC oscillator equals the content stored in the counter dividing by the duration (several milliseconds to dozens of milliseconds).

Figure 8A:
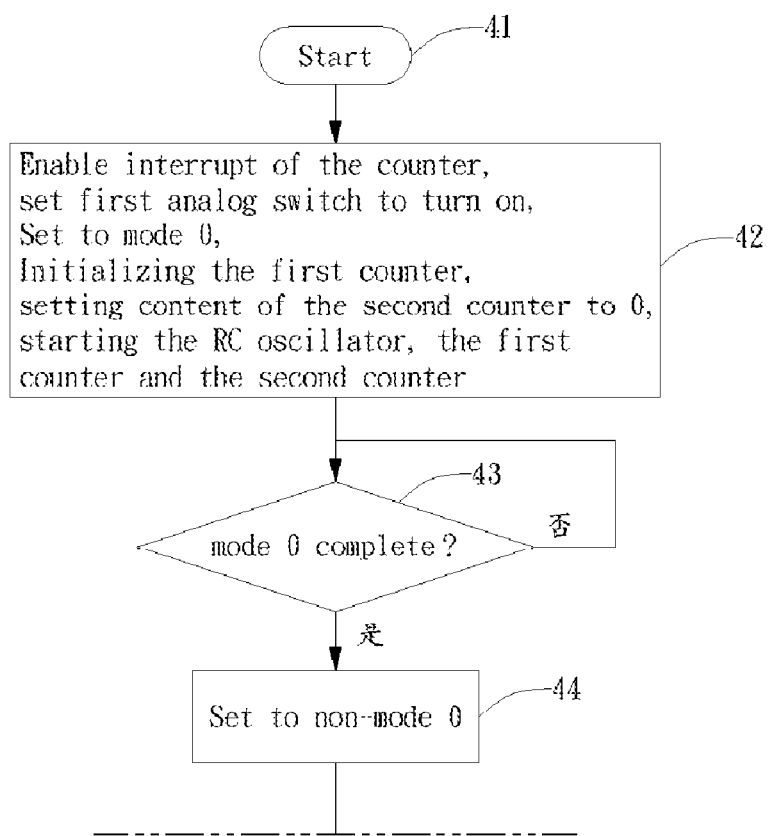
FIG. 8A, 8B and 9 are flowcharts showing detecting the states of touch switches according to an embodiment of the present invention.
Figure 8B:
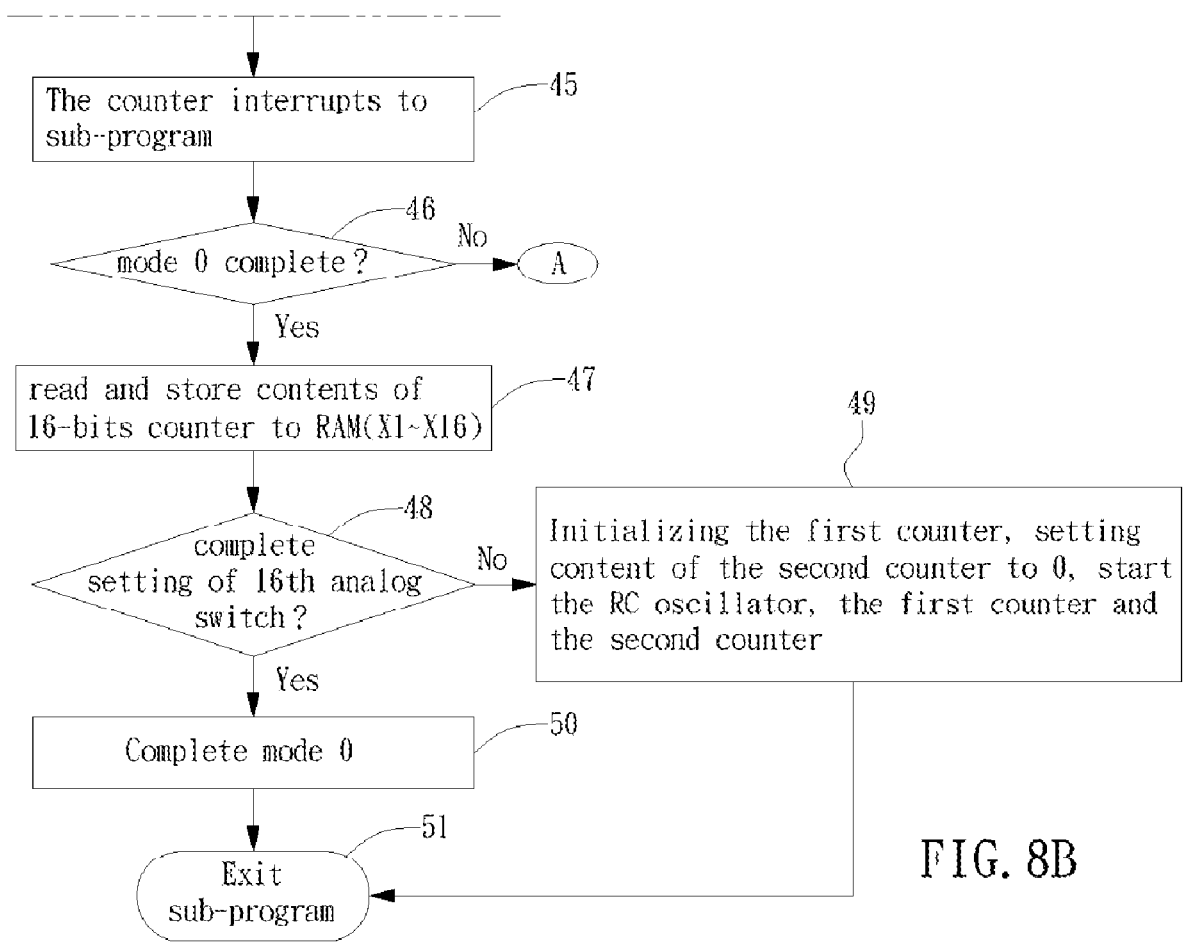
Figure 9:
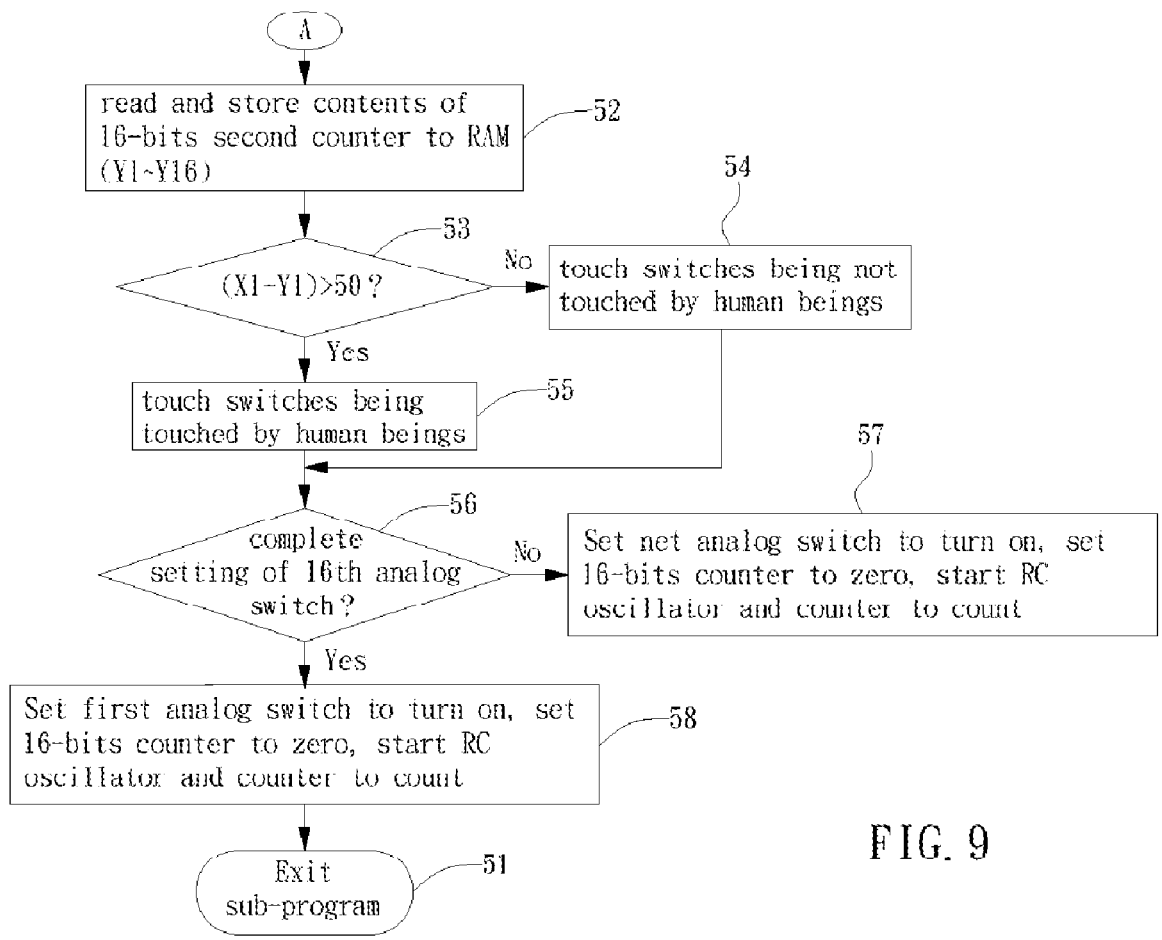

Referring to FIGS. 8A, 8B and 9, the flowchart shows detecting the states of touch switches according to an embodiment of the present invention. The flowchart is organized to the following steps:
 a. determining one of the touch switches for detection;
 b. setting source of a first counter;
 c. configuring the first counter and a second counter to stop counting when the first counter overflows;
 d. initializing the first counter;
 e. setting content of the second counter to 0;
 f. starting the RC oscillator, the first counter and the second counter;
 g. determining whether the first counter and the second counter stop or not, if yes, go to h. step; otherwise, keep g. step;

h. storing content of the first counter in the first memory (X0) of the micro-controller;
i. initializing the first counter;
j. setting content of the second counter to 0;
k. starting the RC oscillator, the first counter and the second counter;
l. determining whether the first counter and the second counter stop or not, if yes, go to m. step; otherwise, keep l. step;
m. storing content of the second counter in the second memory(X1) of the micro-controller;
n. determining whether (X0-X1) is larger than a sensitivity value or not, if yes, the touch switch is off, otherwise, is on; and
o. repeating the steps i. to step n. to continue detecting the touch switches.

Figure 10:
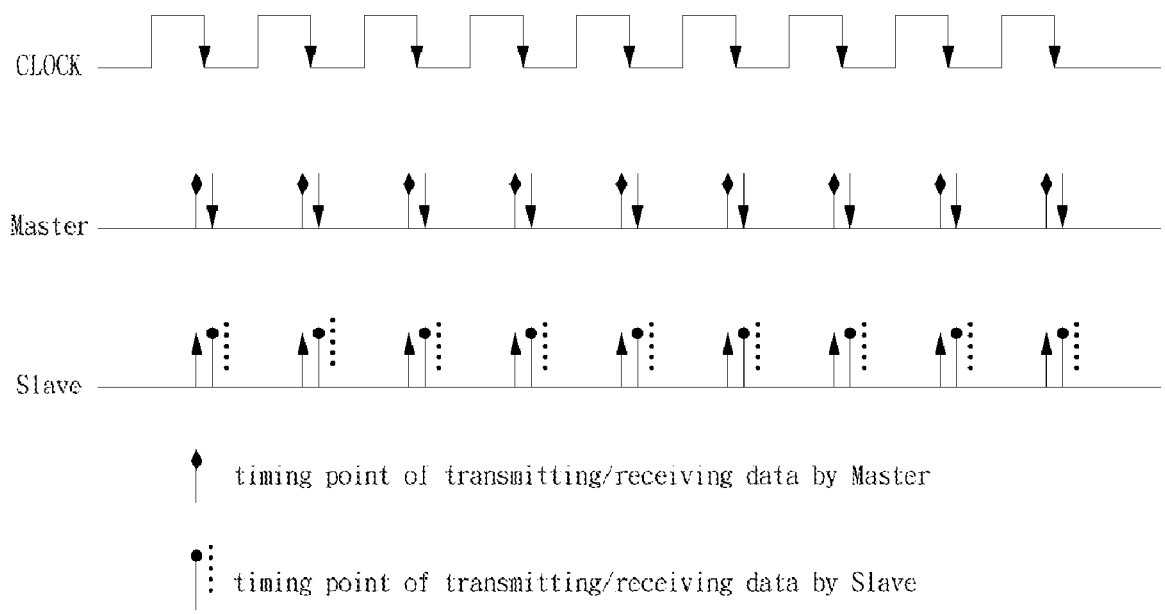
FIG. 10 is a timing diagram showing the transmission timing between the panel control unit and the micro-control unit according to an embodiment of the present invention.

Referring to FIG. 10, it is a timing diagram showing the transmission timing between the panel control unit and the micro-control unit according to an embodiment of the present invention.

In the timing diagram, the master presents the panel control unit and the slave presents the micro-control unit. The master transmits/receives data from output/input pins before the falling edge of the clock, but the slave transmits/receives data from output/input pins after the falling edge of the clock.

Referring to FIG. 11, it is a schematic diagram showing the data format of the panel control unit and the micro-control unit according to an embodiment of the present invention.

Eight 8-bits data, for example, could be encoded in 81 bits. Each one data has a parity bit (bit D8 is even parity of bits D0~D7). Also, bit D72 is even parity of bit D0, D9, D18, D27, D36, D45, D54 and D63. Furthermore, bit D80 is even parity of bits D72~D79. In other word, there are M+N+1 even parity bits if M N-bits data. To prevent the interference from the noise of the AC power (50 Hz or 60 Hz), it should be set the frequency of the RC oscillator to 50 Hz or 60 Hz. More touch switches need detection, less detection speed occurs. For example, detecting 16 touch switches needs 0.32 second (one touch switch 20 ms/50 Hz). The time 0.32 seconds is too slow to tolerate by users. It may be set 200 Hz to detect 16 touch switches that needs only 0.08 seconds. Then detecting the state of the touch switch is on or off needs 0.02 seconds. Totally it needs 0.1 seconds faster than 0.32 seconds.

Methods and systems of the present disclosure, or certain aspects or portions of embodiments thereof, may take the form of program code (i.e., instructions) embodied in media, such as floppy diskettes, CD-ROMS, hard drives, firmware, or any other machine-readable storage medium, wherein, when the program code is loaded into and executed by a machine, such as a computer, the machine becomes an apparatus for practicing embodiments of the disclosure. The methods and apparatus of the present disclosure may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing and embodiment of the disclosure. When implemented on a general-purpose processor, the program code combines with the processor to provide a unique apparatus that operates analogously to specific logic circuits.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for detecting states of a plurality of touch switches, comprising:
   (a) determining one of the touch switches for detection;
   (b) setting source of a first counter;
   (c) configuring the first counter and a second counter to stop counting when the first counter overflows;
   (d) initializing the first counter and the second counter;
   (e) starting a RC oscillator, the first counter and the second counter;
   (f) determining whether the first counter and the second counter stop or not;
   (g) storing content of the first counter in a first memory(X0) of a micro-controller;
   (h) initializing the first counter;
   (i) setting content of the second counter to 0;
   (j) starting the RC oscillator, the first counter and the second counter;
   (k) determining whether the first counter and the second counter stop or not;
   (l) storing content of the first counter in a second memory (X1) of the micro-controller;
   (m) determining whether (X0-X1) is larger than a sensitivity value or not; and
   (n) repeating the steps (i) to (m).

2. The method as claimed in claim 1, wherein the step (a) is performed according to a analog switch on/off control register.

3. The method as claimed in claim 1, wherein the step (d) comprising setting content of the second counter to 0.

4. The method as claimed in claim 1, wherein perform the step (g) when the step (f) is true.

5. The method as claimed in claim 1, wherein perform the step (l) when the step (k) is true.

6. The method as claimed in claim 1, wherein the touch switch is off when the step (m) is true, otherwise the touch switch is on.

* * * * *